(12) United States Patent
Roesner et al.

(10) Patent No.: US 9,455,192 B2
(45) Date of Patent: Sep. 27, 2016

(54) KERF PREPARATION FOR BACKSIDE METALLIZATION

(71) Applicant: Infineon Technologies AG, Neubiberg (DE)

(72) Inventors: Michael Roesner, Villach (AT); Manfred Engelhardt, Villach-Landskron (AT); Johann Schmid, Villach (AT); Gudrun Stranzl, Goedersdorf (AT); Joachim Hirschler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 14/226,666

(22) Filed: Mar. 26, 2014

(65) Prior Publication Data

US 2015/0279740 A1  Oct. 1, 2015

(51) Int. Cl.
| | |
|---|---|
| *H01L 21/46* | (2006.01) |
| *H01L 21/78* | (2006.01) |
| *H01L 21/768* | (2006.01) |
| *H01L 23/00* | (2006.01) |
| *H01L 21/02* | (2006.01) |
| *H01L 21/311* | (2006.01) |

(52) U.S. Cl.
CPC ..... *H01L 21/7806* (2013.01); *H01L 21/02057* (2013.01); *H01L 21/31133* (2013.01); *H01L 21/31138* (2013.01); *H01L 21/76879* (2013.01); *H01L 21/76898* (2013.01); *H01L 21/78* (2013.01); *H01L 24/32* (2013.01); *H01L 2224/48091* (2013.01); *H01L 2224/48247* (2013.01); *H01L 2224/48465* (2013.01); *H01L 2924/10157* (2013.01); *H01L 2924/12042* (2013.01); *H01L 2924/12044* (2013.01)

(58) Field of Classification Search
CPC ............... H01L 21/7806; H01L 21/76879; H01L 21/76898; H01L 24/32; H01L 21/78; H01L 21/02057; H01L 21/31133; H01L 21/31138
USPC ............... 438/68, 458, 460, 462, 464
See application file for complete search history.

(56) References Cited

U.S. PATENT DOCUMENTS

| | | | |
|---|---|---|---|
| 5,539,325 A | 7/1996 | Rostoker et al. | |
| 6,972,202 B2 | 12/2005 | Nishihashi et al. | |
| 7,135,384 B2 | 11/2006 | Takyu et al. | |
| 7,923,351 B2 | 4/2011 | Arita | |
| 8,940,636 B2 * | 1/2015 | Pagaila | H01L 21/568 257/678 |
| 2001/0043076 A1 | 11/2001 | Itasaka et al. | |
| 2002/0013061 A1 | 1/2002 | Siniaguine et al. | |

(Continued)

FOREIGN PATENT DOCUMENTS

CN  101044613 A  9/2007

OTHER PUBLICATIONS

Mariani, F., et al., "Current Challenges in Preassembly: The Focus Changes from Thinning to Singulation," KGD Packaging & Test Workshop, Napa, California, Sep. 9-12, 2007, 29 pages.

*Primary Examiner* — Kevin M Picardat
(74) *Attorney, Agent, or Firm* — Slater Matsil, LLP

(57) ABSTRACT

In accordance with an embodiment of the present invention, a method of forming a semiconductor device includes attaching a substrate to a carrier using an adhesive component and forming a through trench through the substrate to expose the adhesive component. At least a portion of the adhesive component is etched and a metal layer is formed over sidewalls of the through trench.

20 Claims, 15 Drawing Sheets

(56) References Cited

U.S. PATENT DOCUMENTS

| | | |
|---|---|---|
| 2002/0030040 A1 | 3/2002 | Farnworth |
| 2003/0160315 A1 | 8/2003 | Kovar et al. |
| 2004/0232524 A1 | 11/2004 | Howard et al. |
| 2005/0146013 A1 | 7/2005 | Farnworth et al. |
| 2005/0287952 A1 | 12/2005 | Ryan et al. |
| 2007/0158807 A1* | 7/2007 | Lu ................ H01L 25/0657 257/686 |
| 2008/0001269 A1* | 1/2008 | Hsu ................ H01L 21/76898 257/678 |
| 2008/0213978 A1 | 9/2008 | Henry et al. |
| 2008/0274603 A1* | 11/2008 | Do ................ H01L 21/76898 438/462 |
| 2011/0193200 A1 | 8/2011 | Lyne et al. |
| 2011/0291287 A1 | 12/2011 | Wu et al. |
| 2013/0084658 A1 | 4/2013 | Vaupel et al. |
| 2013/0084659 A1 | 4/2013 | Martens et al. |
| 2014/0070420 A1 | 3/2014 | Sapone |

\* cited by examiner

KERF PREPARATION FOR BACKSIDE METALLIZATION

TECHNICAL FIELD

The present invention relates generally to semiconductor devices, and, in particular embodiments, to kerf preparation for backside metallization.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically treated and the semiconductor devices are physically separated to form individual dies. Purely mechanical separation is not very space efficient compared to chemical processes. However, chemical separation of small sized dies requires overcoming many difficult process issues.

SUMMARY OF THE INVENTION

In accordance with an embodiment of the present invention, a method of forming a semiconductor device comprises attaching a substrate to a carrier using an adhesive component and forming a through trench through the substrate to expose the adhesive component. At least a portion of the adhesive component is etched and a metal layer is formed over sidewalls of the through trench.

In accordance with an embodiment of the present invention, a method of forming a semiconductor device comprises using an adhesive component, mounting a substrate comprising a trench in a kerf region to a carrier. The adhesive component is disposed at least partially within the trench. A through trench is formed through the substrate to expose the adhesive component. A mesa comprising the adhesive component is formed while forming the through trench. The mesa is etched to expose the carrier using an anisotropic etch process. A metal layer is formed over sidewalls of the through trench.

In accordance with an embodiment of the present invention, a method of forming a semiconductor device comprises using an adhesive component, mounting a substrate comprising a trench in a kerf region to a carrier. The adhesive component is disposed at least partially within the trench. The method further includes forming a through trench through the substrate to expose the adhesive component. A spacer is formed on sidewalls of the substrate by etching the adhesive component. A metal layer is formed over sidewalls of the through trench.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
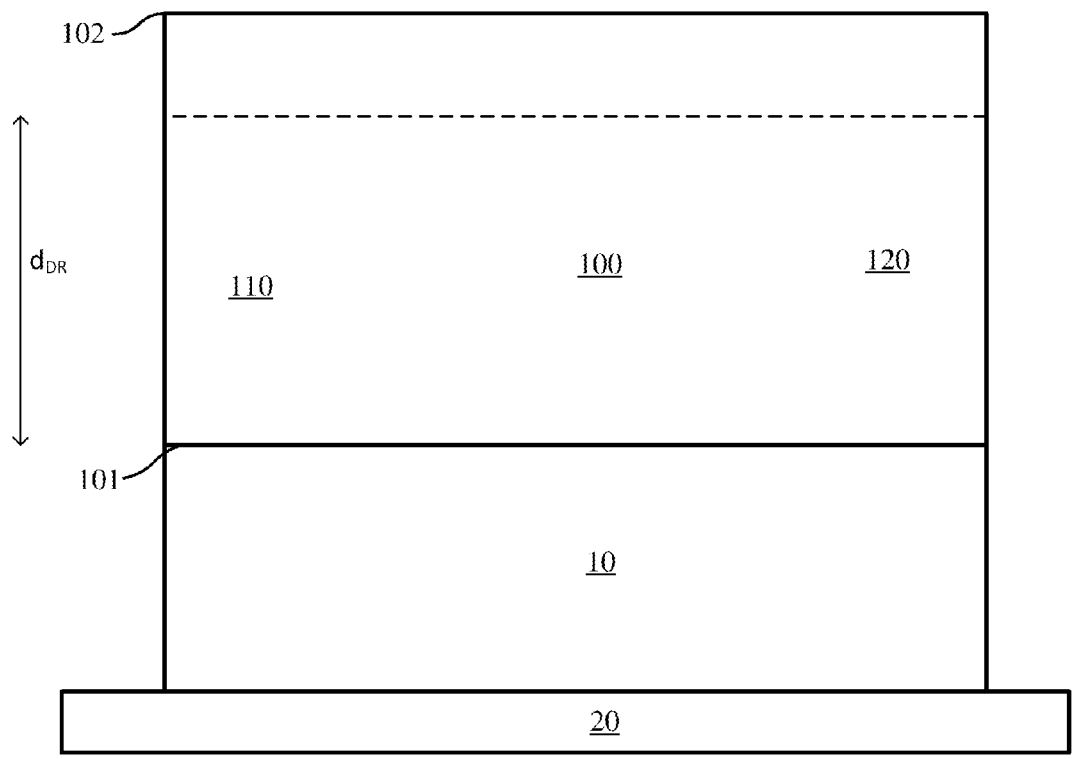
FIG. 1 illustrates a semiconductor device during fabrication after mounting a substrate over a carrier in accordance with embodiments of the present invention.

During the semiconductor assembly process, metallization is formed on the back side of the dies prior to attaching the dies to a die paddle or supporting platform for the dies. The dies are singulated from a common substrate using a chip separation processes such as mechanical dicing, dry laser dicing, water-jet guided laser dicing, stealth dicing, or plasma dicing.

One such process includes plasma dicing after grinding (PDAG). In PDAG, the semiconductor wafer is attached to a carrier system by utilization of an appropriate force-locked connection element, e.g. an adhesive acrylic glue layer. After grinding from the backside, die singulation is performed using mechanical or plasma dicing prior to the backside metallization step. Accordingly, separation trenches are diced or etched into the kerfs of the thinned semiconductor wafer. The separation trenches expose the underlying adhesive acrylic glue layer. A backside metal stack composed of a variety of different electrically conducting material layers (e.g., metals or alloys) is deposited into the open etched separation trenches in the kerf. During the deposition of the metal stack, the exposed adhesive acrylic glue layer outgasses volatile organic compounds (VOCs) into the deposition chamber. This outgassing of the volatile organic compounds (VOCs) originating from the large open glue area changes the vacuum pressure of the deposition chamber. As a consequence, the deposition pressure in the deposition chamber is increased by an order of magnitude, which results in inclusion of some of the impurities into the metal stack.

Backside metallization processes can be used for metal sputtering into open plasma etched trenches only with reduced pressure levels. By using reduced pressure levels, the chemical specimen outgas sing from the glue layer are incorporated into all individual backside metal layers during their deposition steps and result in an increased contamination of the metal stack and change/roughening of the metallic interfaces, e.g., by metal corrosion. For example, because of the reduced sputtering pressure levels, the chemicals such as carbon, chlorine, and oxygen, which are outgas sing from the glue layer are incorporated into all individual backside metal layers during their deposition steps and result in increased contamination of the metal stack. This degrades electrical and mechanical properties of the metallic interfaces. As an illustration, the interfaces of the metal stack may corrode over time due to the introduction of these corrosive species such as chlorine and/or chlorine containing compounds from the glue, which increases reliability failures. Therefore, a process in which metal is sputtered while exposing large areas of the glue is not compatible with mass production.

In various embodiments, the preparation of the kerf prior to backside metallization may be accomplished by appropriate etching techniques. In various embodiments, a sequence of etching techniques is employed to maintain the glue to acceptable levels.

FIGS. 1-5 illustrate a semiconductor device during singulation and back side metallization in accordance with an embodiment of the present invention.

FIG. 1 illustrates a semiconductor device during fabrication after mounting a substrate over a carrier in accordance with embodiments of the present invention.

Referring to FIG. 1, a semiconductor substrate 100 after the completion of front end processing and back end processing is illustrated. The semiconductor substrate 100 has a plurality of semiconductor devices, e.g., a first chip 110, a second chip 120, formed within. Each of these chips may be any type of chip. For example, the chip may be a logic chip, a memory chip, an analog chip, and other types of chips. The chip may comprise a plurality of devices such as transistors or diodes forming an integrated circuit or may be a discrete device such as a single transistor or a single diode.

In one embodiment, the substrate 100 may comprise a semiconductor wafer such as a silicon wafer. In other embodiments, the substrate 100 may comprise other semiconductor materials including alloys such as SiGe, SiC or compound semiconductor materials such as GaAs, InP, InAs, GaN, sapphire, silicon on insulation, for example. The substrate 100 may include epitaxial layers in one or more embodiments.

Referring to FIG. 1, device regions including the first chip 110 and the second chip 120 are disposed within the substrate 100. The device regions may include doped regions in various embodiments. Further, some portion of the device regions may be formed over the substrate 100. The device regions may include the active regions such as channel regions of transistors.

The substrate 100 comprises a front side 101 and an opposite back side 102. In various embodiments, the active devices are formed closer to the front side 101 of the substrate 100 than the back side 102. The active devices are formed in device regions of the substrate 100. Device regions extends over a depth $d_{DR}$, which depending on the device, is about 50 μm to about 500 μm, and about 200 μm in one embodiment.

In various embodiments, all necessary interconnects, connections, pads etc. for coupling between devices and/or with external circuitry are formed over the front side 101 of the substrate 100. Accordingly, a metallization layer is formed over the substrate 100. The metallization layer may comprise one or more levels of metallization. Each level of metallization may comprise metal lines or vias embedded within an insulating layer. The metallization layer may comprise metal lines and vias to contact the device regions and also to couple different devices within the chips.

A protective layer, such as a passivation layer, may be formed over the metallization layer before further processing. The protective layer may comprise an oxide, nitride, polyimide, or other suitable materials known to one skilled in the art. The protective layer may comprise a hard mask in one embodiment, and a resist mask in another embodiment. The protective layer helps to protect the metallization layer as well as the device regions during subsequent processing.

After forming the protective layer, the back side 102 of the substrate 100 is attached to a carrier 20 using an adhesive component 10. Further, in some embodiments, a primer coating may be applied prior to coating the adhesive component 10. The primer coating is tuned to react with the surface of the substrate 100 and convert potentially high surface energy surfaces to lower surface energy surfaces by forming a primer layer. Thus, in this embodiment, the adhesive component 10 interacts only with the primer layer improving the bonding.

In one or more embodiments, the adhesive component 10 may comprise a substrate, e.g., polyvinyl chloride, with the coating of an adhesive layer such as an acrylic resin.

The adhesive component 10 may comprise an organic compound such an epoxy based compound in alternative embodiments. In various embodiments, the adhesive component 10 comprises an acrylic based, not photoactive, organic glue. In one embodiment, the adhesive component 10 comprises acrylamide. In another embodiment, the adhesive component 10 comprises SU-8, which is a negative tone epoxy based photo resist.

In alternative embodiments, the adhesive component 10 may comprise a molding compound. In one embodiment, the adhesive component 10 comprises an imide and/or components such a poly-methyl-methacrylate (PMMA) used in forming a poly-imide.

In another embodiment, the adhesive component 10 comprises components for forming an epoxy-based resin or co-polymer and may include components for a solid-phase epoxy resin and a liquid-phase epoxy resin. Embodiments of the invention also include combinations of different type of adhesive components and non-adhesive components such as combinations of acrylic base organic glue, SU-8, imide, epoxy-based resins etc.

In various embodiments, the adhesive component 10 comprises less than about 1% inorganic material, and about 0.1% to about 1% inorganic material in one embodiment. The absence of inorganic content improves the removal of the adhesive component 10 without leaving residues after plasma etching.

In one or more embodiments, the adhesive component 10 may comprise thermosetting resins, which may be cured by annealing at an elevated temperature. Alternatively, in some embodiments, a low temperature annealing or bake may be performed to cure the adhesive component 10 so that adhesive bonding between the carrier 20 and the adhesive component 10 and between the adhesive component 10 and the substrate 100 is formed. Some embodiments may not require any additional heating and may be cured at room temperature.

After mounting the substrate 100 over the carrier 20 using the adhesive component 10, the substrate 100 is subjected to a thinning process. The final depth of the chip formed in the substrate 100 will be determined after thinning. The bottom surface of the first chip 110 and the second chip 120 is therefore shown as dashed lines, which will be exposed after a thinning process. A thinning tool, which may be a grinding tool in one embodiment, reduces the thickness of the substrate 100. In another embodiment, the thinning tool may use a chemical process such as wet etching or plasma etching to thin the substrate 100.

Figure 2:
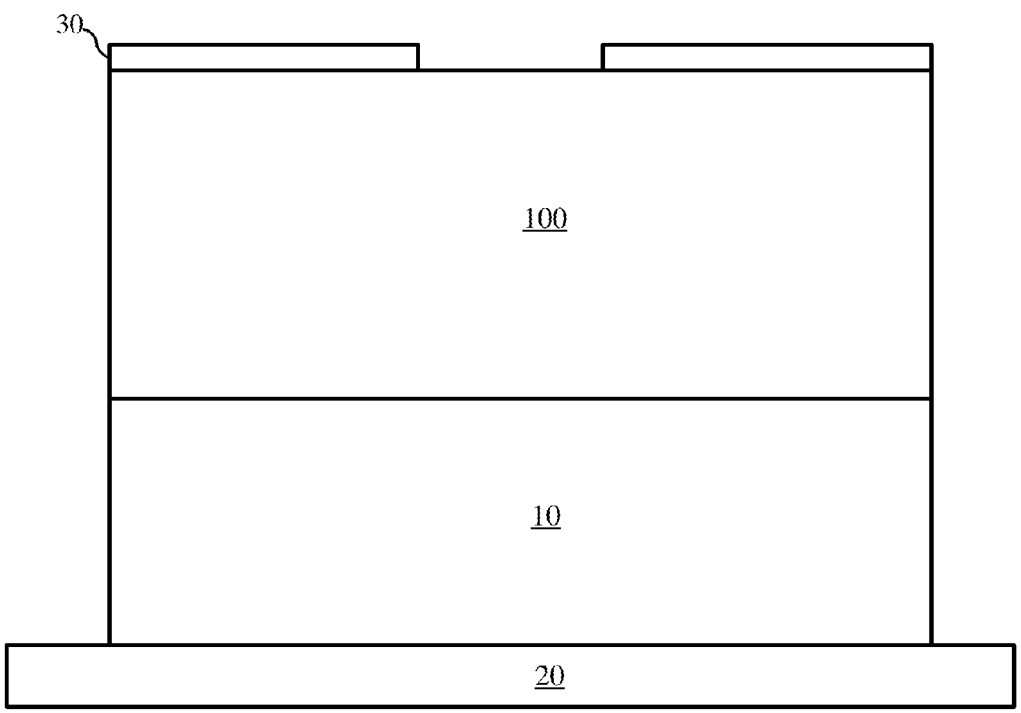
FIG. 2 illustrates a semiconductor device during fabrication after forming a patterned resist layer over a substrate mounted over a carrier in accordance with embodiments of the present invention.

FIG. 2 illustrates a semiconductor device during fabrication after forming a patterned resist layer over a substrate mounted over a carrier in accordance with embodiments of the present invention.

Referring to FIG. 2, a resist layer 30 is deposited over the back side of the thinned substrate 100. The resist layer 30 may include a photoresist layer such as a negative resist in various embodiments. For example, in case the resist layer 30 is a negative resist, portions of the resist layer 30 that are exposed becomes insoluble to the photoresist developer while the unexposed portion of the resist layer 30 is dissolved by a photoresist developer. The resist layer 30 may include hard mask in some embodiments.

Figure 3:
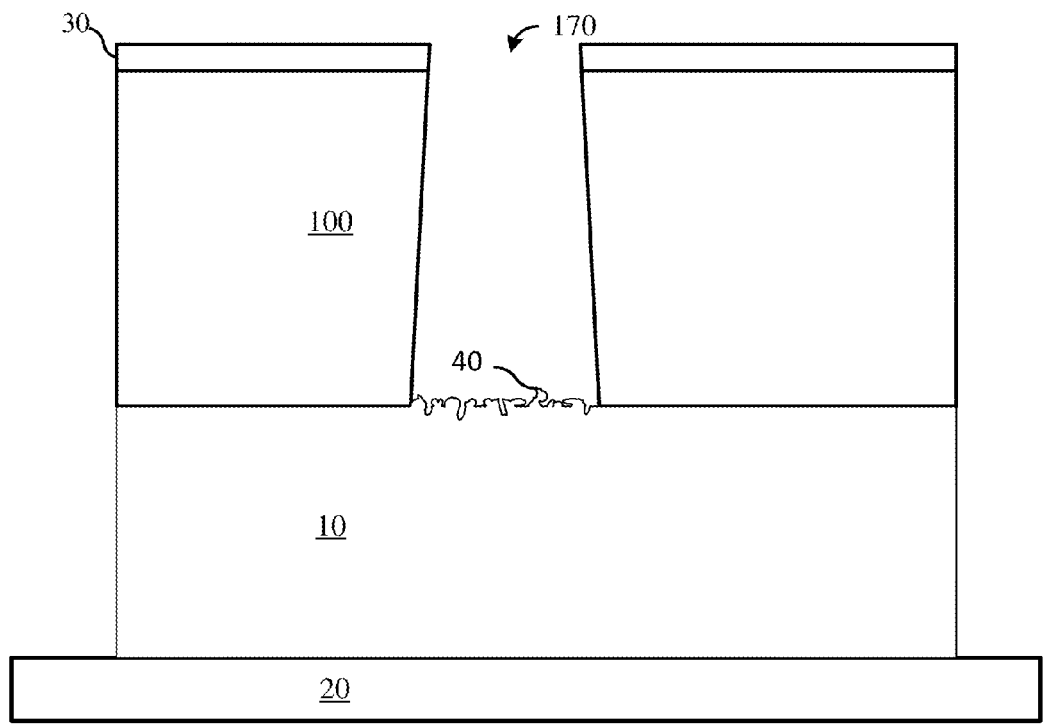
FIG. 3 illustrates a semiconductor device during fabrication after forming through trenches in the kerf regions of the semiconductor device in accordance with embodiments of the present invention.

FIG. 3 illustrates a semiconductor device during fabrication after forming through trenches in the kerf regions of the semiconductor device in accordance with embodiments of the present invention.

Next, referring to FIG. 3, using the patterned resist layer 30, the substrate 100 may be etched using a plasma process to form the dicing trench 170. In one embodiment, the plasma process may comprise a deep reactive ion etch process such as a Bosch process, which is a two-step process in which an etching step and a passivation step alternately follow one after the other. For the etching step, for example, $SF_6$ can be used within a carrier gas such as argon by generating high frequency plasma. During the passivation step, a mixture of $C_4F_8$ and argon may be used as a carrier gas. During the passivation step, a passivation layer of a polymer material is formed on the bottom and vertical side walls of the etched opening. Thus, the Bosch process produces sidewalls that are scalloped. Using such an etching method, aspect ratios of up to 50:1 can be achieved. However, after the plasma etching process, the adhesive component 10 that is exposed has a very rough surface. In other words, the adhesive component 10 has a change in surface morphology, e.g., change of surface waviness, surface roughness or micro, surface chemical composition. As illustration, the chemical composition may vary from the surface, for example, over a depth of about 10 nm, or an ash or an easily removable material may be present at the surface.

During subsequent metallization process, the large surface roughness of the adhesive component 10 results in outgassing as well as increase in particle contamination (e.g., small protrusions 40 of the adhesive component 10 may break off). This contaminates the metal stack that is being deposited.

Figure 4:
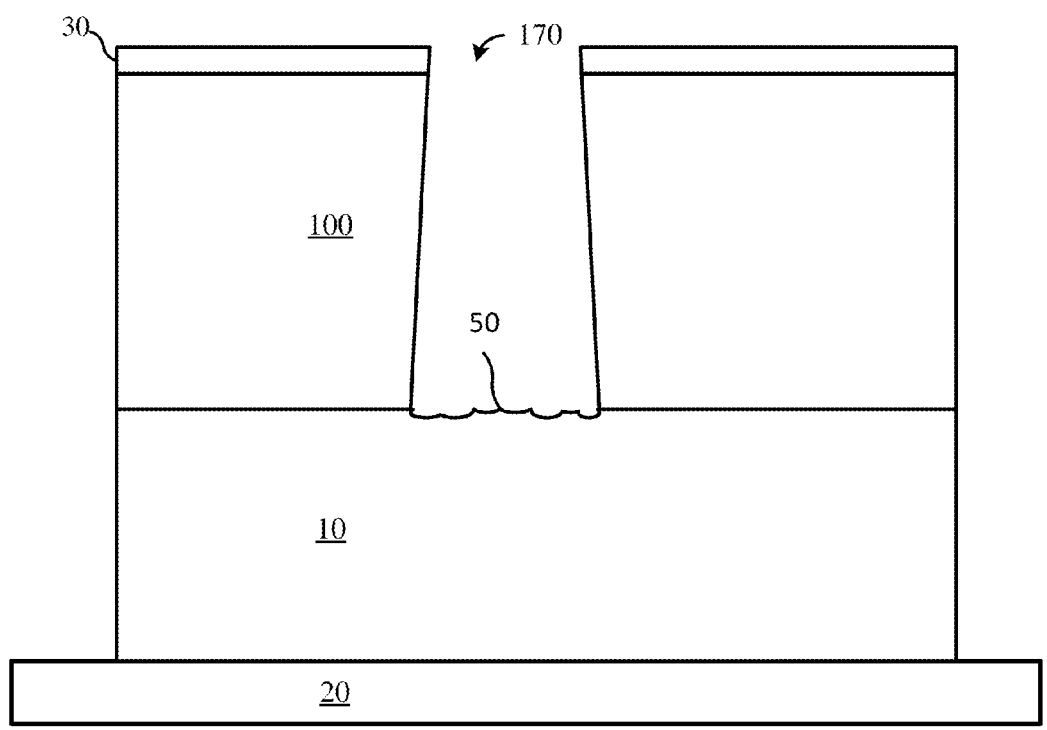
FIG. 4 illustrates a semiconductor device during fabrication after a smoothening process in accordance with embodiments of the present invention.

FIG. 4 illustrates a semiconductor device during fabrication after a smoothening process in accordance with embodiments of the present invention.

In one or more embodiments, an isotropic etching process may be used to smoothen the surface of the adhesive component 10. In one or more embodiments, the isotropic etching process may be performed using a wet etch processing using an appropriate etchant.

In one or more embodiments, the smoothening process may include a cleaning process. The cleaning process may include a RCA clean comprising hydrogen peroxide such as SC-1 or SC-2, which are hydrogen peroxide solutions mixed with ammonium hydroxide or hydrochloric acid. Alternatively, in other embodiments the cleaning process may include a dilute hydrofluoric acid clean process or a sulfuric acid/hydrogen peroxide solution.

In various embodiments, the smoothening etching process may remove a top layer of the adhesive component 10. As the etchant attacks the rough exposed surface of the adhesive component 10 from multiple directions, the micro roughness is removed or improved significantly. However, the etch proceeds by magnifying some of the features, which results in surface waviness 50 as illustrated in FIG. 4. While the surface is wavy, it has a much better surface roughness than the prior surface illustrated in FIG. 3. For example, the surface roughness of the surface of the adhesive component 10 after the smoothening process may be at least five times better than the surface roughness of the surface of the adhesive component 10 with protrusions 40 in FIG. 3. Further, the smoothening process removes all the loose particles in the surface of the adhesive component 10.

Thus in this embodiment, a special etching sequence, e.g. by a special dry plasma etching technique is applied to smoothen the adhesive component 10 inside the kerf in order to avoid a sharp surface topography.

Figure 5:
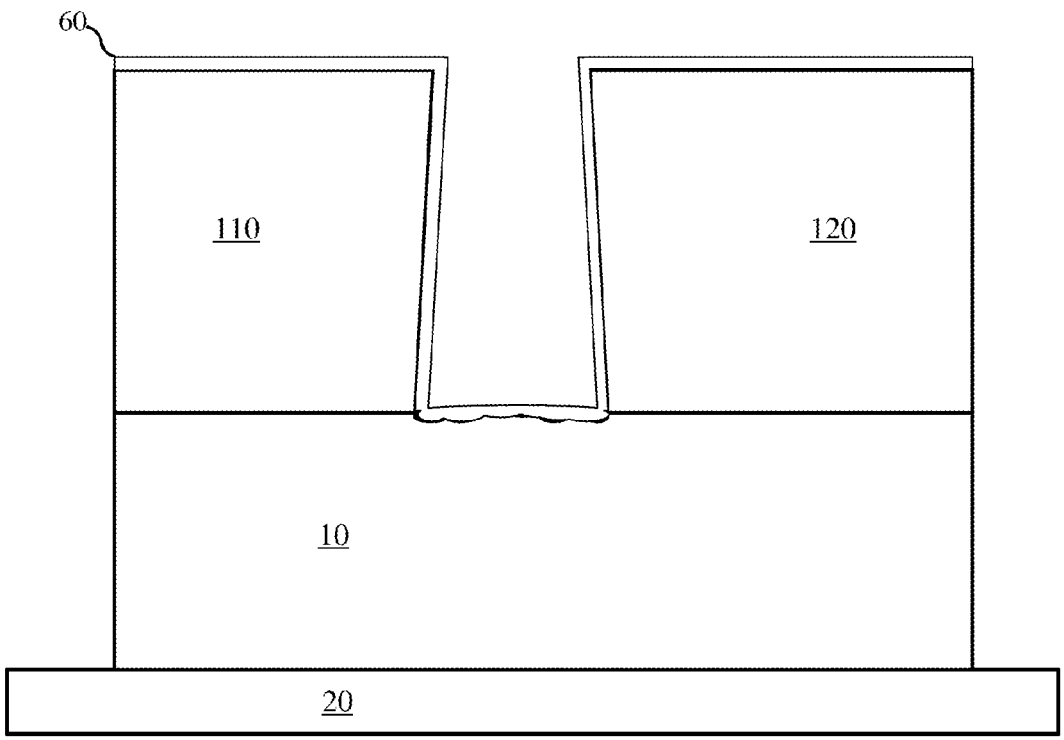
FIG. 5 illustrates a semiconductor device during fabrication after depositing a back side metallization layer in accordance with embodiments of the present invention.

FIG. 5 illustrates a semiconductor device during fabrication after depositing a back side metallization layer in accordance with embodiments of the present invention.

A back side metallization layer 60 is formed on the exposed back surface and sidewalls of the substrate 100 (e.g., first chip 110 and second chip 120).

In various embodiments, the back side metallization layer 60 may comprise more than one metal layer. In one or more embodiments, the back side metallization layer 60 may be deposited using a physical vapor deposition process. In alternative embodiments, the back side metallization layer 60 may be deposited using other vapor deposition processes including chemical vapor deposition, atomic layer deposition, electrochemical deposition, electroless deposition, and others.

In one or more embodiments, the back side metallization layer 60 comprises aluminum. In an alternative embodiment, the back side metallization layer 60 comprises copper. In one embodiment, the back side metallization layer 60 comprises a metal silicide. In another embodiment, the back side metallization layer 60 comprises a metal nitride such as titanium nitride, tungsten nitride, tantalum nitride. In a further alternative embodiment, the back side metallization layer 60 comprises a solder compatible material, for example, may comprise one or more of silver, tin, gold, platinum, lead, indium, cadmium, bismuth.

The back side metallization layer 60 may be diced or may be sufficiently thin such that it is easily broken by mechanical pressure (e.g., bending) so as to form a plurality of semiconductor devices, e.g., separated first chip 110 and second chip 120.

Figure 6:
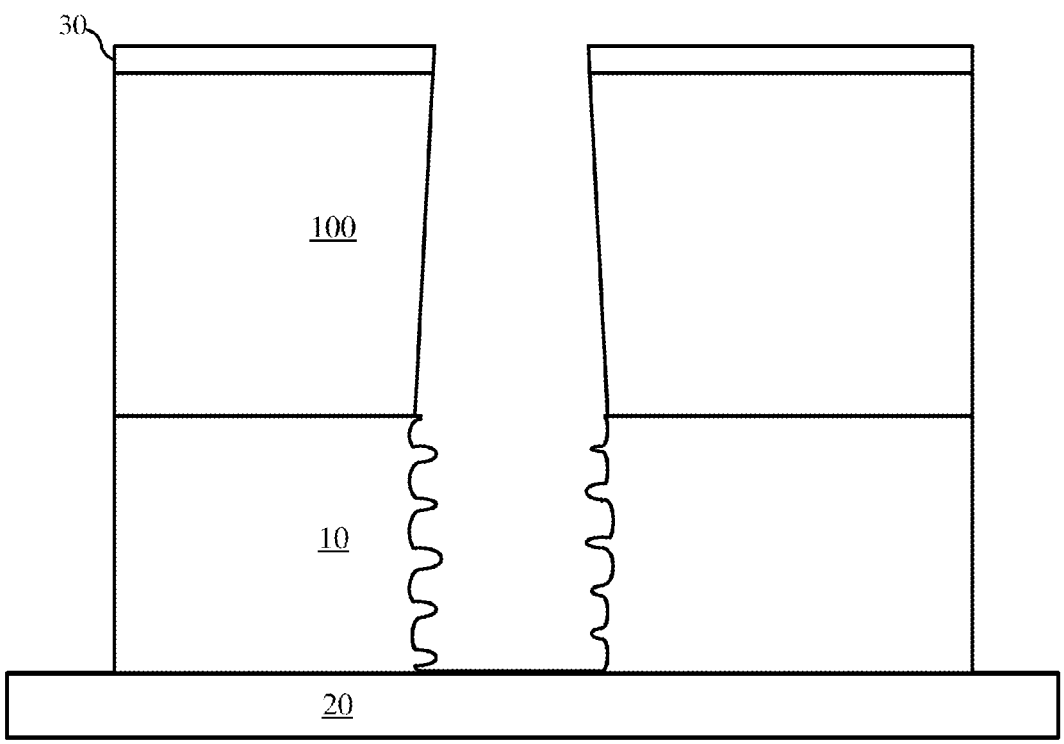
FIG. 6 illustrates a semiconductor device during fabrication after removing the exposed adhesive component under the through trench in accordance with embodiments of the present invention.
Figure 7:
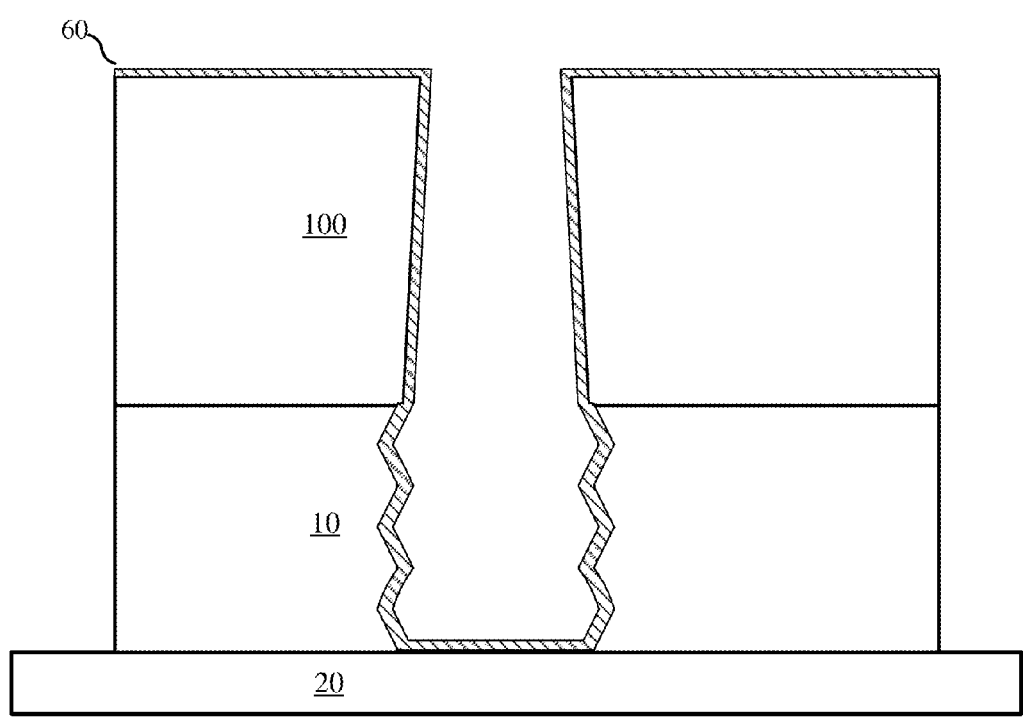
FIG. 7 illustrates a semiconductor device during fabrication after depositing a back side metallization layer in accordance with embodiments of the present invention.

FIG. 6-7 illustrates an alternative embodiment of the semiconductor device during fabrication in accordance with an embodiment of the present invention.

FIG. 6 illustrates a semiconductor device during fabrication after removing the exposed adhesive component in accordance with embodiments of the present invention.

In this embodiment, the adhesive component 10 is etched so that the subsequent metal deposition is not exposed to the large surface area of the adhesive component 10. In one or more embodiments, an anisotropic etching process is used to etch through the adhesive component 10. In one or more embodiments, the etching process may be a deep reactive ion etching process. In various embodiments, the adhesive component 10 is etched using an etchant comprising oxygen and/or fluorine ions and radicals.

In various embodiments, the removal of the adhesive component 10 that is inside the kerf will reduce the area of the exposed adhesive component 10 significantly and improves the vacuum levels by one to two orders of magnitude during sputter deposition of the back side metal stack. The improvement in vacuum levels advantageously allows contamination-free metal deposition on the chip backside and into the kerf for the defect-free die attach in the backend.

In various embodiments, an anisotropic etching process is used to remove the adhesive component 10 to minimize lateral undercut so as to prevent the etchant removing the protective layer (such as imide) covering the contact pads of the front side of the dies.

FIG. 7 illustrates a semiconductor device during fabrication after depositing a back side metallization layer in accordance with embodiments of the present invention.

Referring to FIG. 7, a back side metallization layer 60 is formed on the exposed back surface and sidewalls of the substrate 100 (first chip 110 and second chip 120). The back side metallization layer 60 is also formed on the exposed carrier 20. The first chip 110 is separated from the second chip 120 after removing the adhesive component 10 and by dicing or breaking the back side metallization layer 60.

FIG. 8-14 illustrates an alternative embodiment of the semiconductor device during fabrication in accordance with an embodiment of the present invention.

Figure 8:
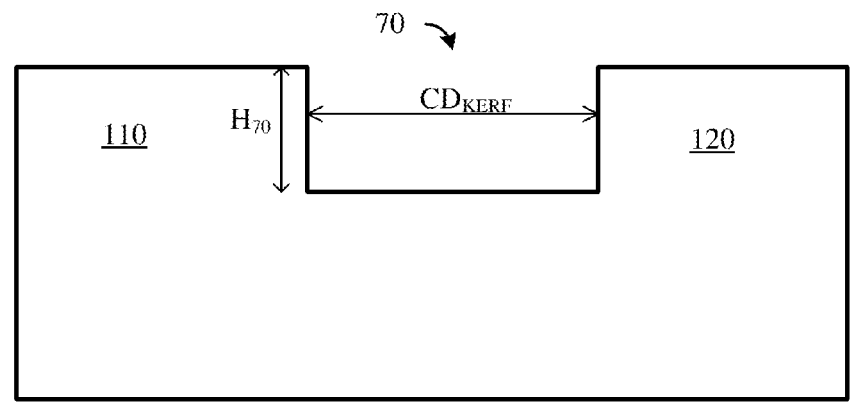
FIG. 8 illustrates a semiconductor device during fabrication after forming a plurality of trenches in accordance with embodiments of the present invention.

FIG. 8 illustrates a semiconductor device during fabrication after forming a plurality of trenches in accordance with embodiments of the present invention.

As in prior embodiments, the substrate 100 undergoes all processing to form the active regions and front side metallization layers. A plurality of trenches 70 is formed. In various embodiments, the plurality of trenches 70 is formed using a plasma dicing process. The plurality of trenches 70 are formed along the dicing channels.

As illustrated in FIG. 8, after the partial dicing, the height $H_{70}$ of the plurality of trenches 70 is about 50 µm to about 500 µm, and about 200 µm in one embodiment. The critical dimension $CD_{KERF}$ of the dicing channels (or width of the plurality of trenches 70) may be about 10 µm to about 50 µm, and about 20 µm in one embodiment.

Figure 9:
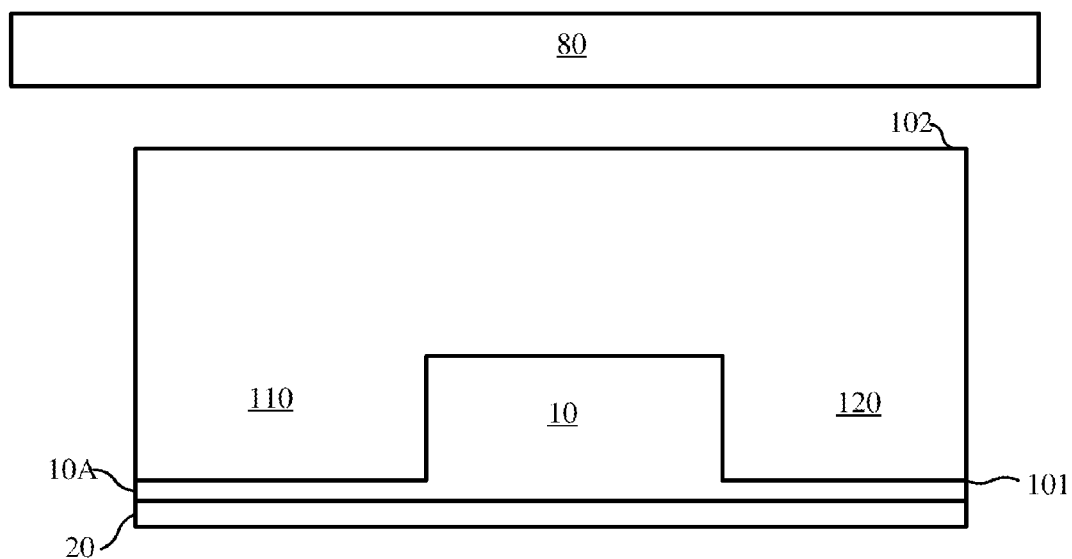
FIG. 9 illustrates a semiconductor device during fabrication after mounting the substrate over a carrier in accordance with embodiments of the present invention.

FIG. 9 illustrates a semiconductor device during fabrication after mounting the substrate over a carrier in accordance with embodiments of the present invention.

Referring to FIG. 9, the substrate 100 is mounted on the carrier 20 using the adhesive component 10. The plurality of trenches 70 is filled with an adhesive component 10. In various embodiments, the adhesive component 10 surrounds all the sidewalls of the plurality of trenches 70, e.g., around the first chip 110 and the second chip 120. In various embodiments, having an adhesive layer over only the top surface may not be sufficient to provide mechanical stability because of the large number of chips in the substrate 100, e.g., especially for smaller chip geometries, which may be about 200,000 to about 500,000 per wafer. Thus, the substrate 100 is mechanically supported along the sidewalls to avoid mechanical failure of the substrate 100 during the subsequent thinning process.

After filling the plurality of trenches 70 with the adhesive component 10, an overfill layer 10A is formed over the front side 101 of the substrate 100. In various embodiments, the overfill layer 10A has a thickness of about 1 µm to about 100 µm.

A carrier 20 is placed over the overfill layer 10A of the adhesive component 10. The viscous nature of the adhesive component 10 allows it to flow along the sidewalls of the plurality of trenches 70. In various embodiments, the adhesive component 10 is selected to maximize wetting of the sidewalls of the plurality of trenches 70 by selecting an adhesive having the appropriate surface tension and viscosity.

After mounting the substrate 100 on the carrier 10, the substrate 100 is thinned from the back side 102 using a thinning tool 80, which may be a grinding wheel in some embodiments. Alternatively, the thinning may be performed chemically using an etching process.

Figure 10:
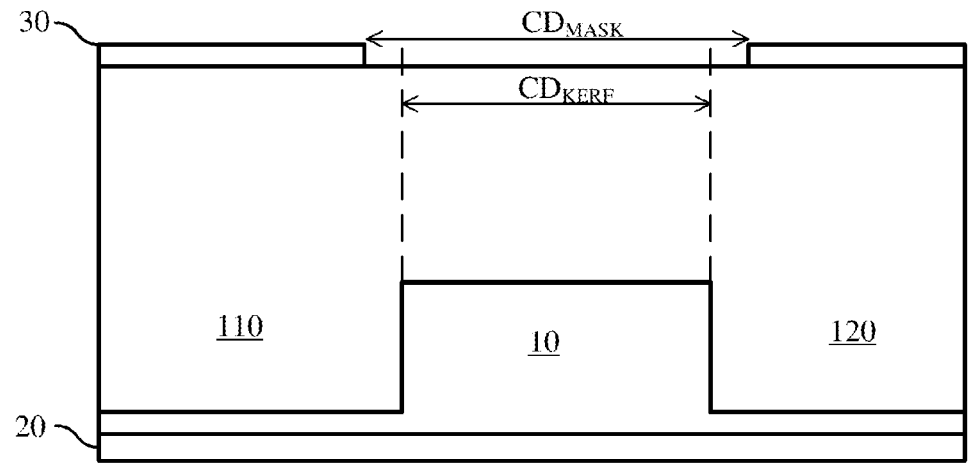
FIG. 10 illustrates a semiconductor device during fabrication after thinning and forming a patterned resist layer in accordance with embodiments of the present invention.

FIG. 10 illustrates a semiconductor device during fabrication after forming a patterned resist layer in accordance with embodiments of the present invention.

Referring to FIG. 10, after thinning the substrate 100, the exposed back side is patterned with a resist layer 30. In a first example, the critical dimension of the patterned resist layer 30 $CD_{MASK}$ is greater than the critical dimension $CD_{KERF}$ of the dicing channels.

Figure 11:
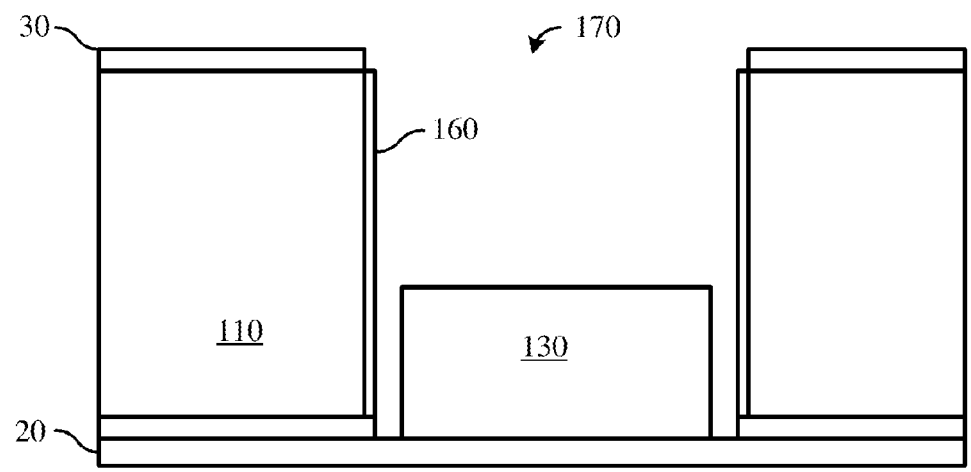
FIG. 11 illustrates a semiconductor device during fabrication after etching the substrate and the underlying adhesive component in accordance with embodiments of the present invention.

FIG. 11 illustrates a semiconductor device during fabrication after etching the substrate and the underlying adhesive component in accordance with embodiments of the present invention.

Referring to FIG. 11, the substrate 100 exposed after patterning the resist layer 30 is exposed to a plasma etching process. A deep reactive ion etching process may be used in one or more embodiments. For example, a Bosch etch process as described previously may be used in one or more embodiments.

Because of the anisotropic nature of the etching process, the adhesive component 10 is removed along the sidewalls of the substrate 100 leaving behind a mesa 130. The plasma etching process leaves a polymer residue 160 on the sidewalls of the substrate 100.

Figure 12:
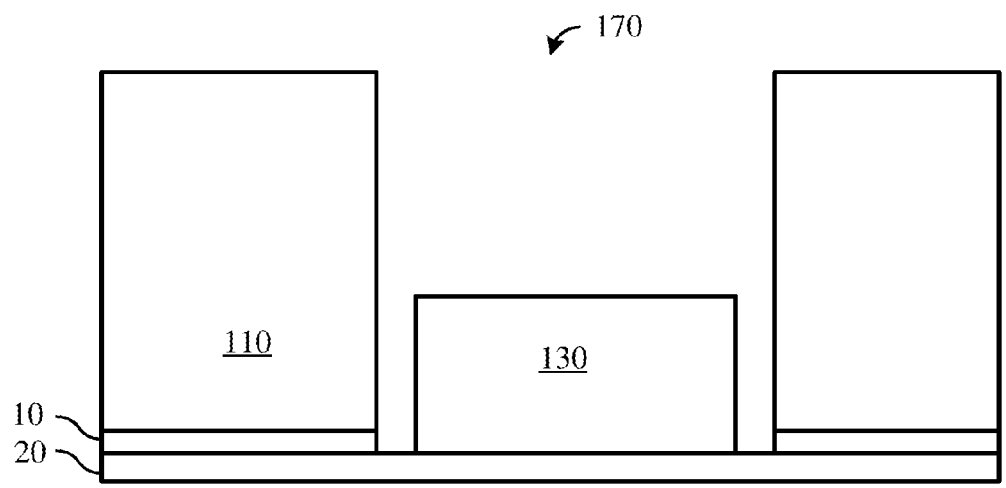
FIG. 12 illustrates a semiconductor device during fabrication after etching the polymer residue in accordance with embodiments of the present invention.

FIG. 12 illustrates a semiconductor device during fabrication after etching the polymer residue in accordance with embodiments of the present invention.

The polymer residue 160 may be removed using a wet etching process and/or a dry etching process in various embodiments. In one embodiment, the polymer residue 160 is removed using wet chemistry, an ashing process.

Figure 13:
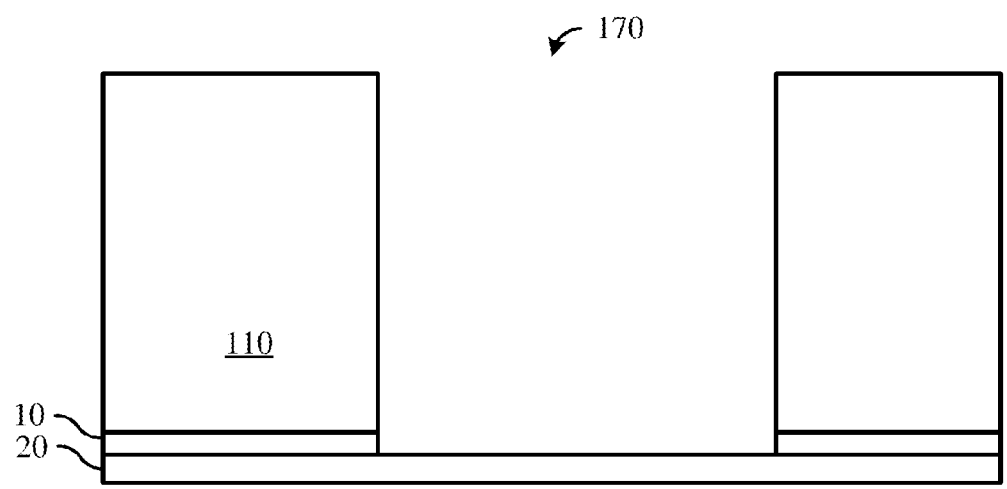
FIG. 13 illustrates a semiconductor device during fabrication after selectively etching the adhesive component in accordance with embodiments of the present invention.

FIG. 13 illustrates a semiconductor device during fabrication after selectively etching the adhesive component in accordance with embodiments of the present invention.

As next illustrated in FIG. 13, the adhesive component 10 is etched using a selective etch chemistry. The etching is selected to avoid etching the substrate 100 and the carrier 20 while etching the adhesive component 10. The etching is anisotropic to avoid detaching the substrate 100 from the carrier 20 during the etching.

Figure 14:
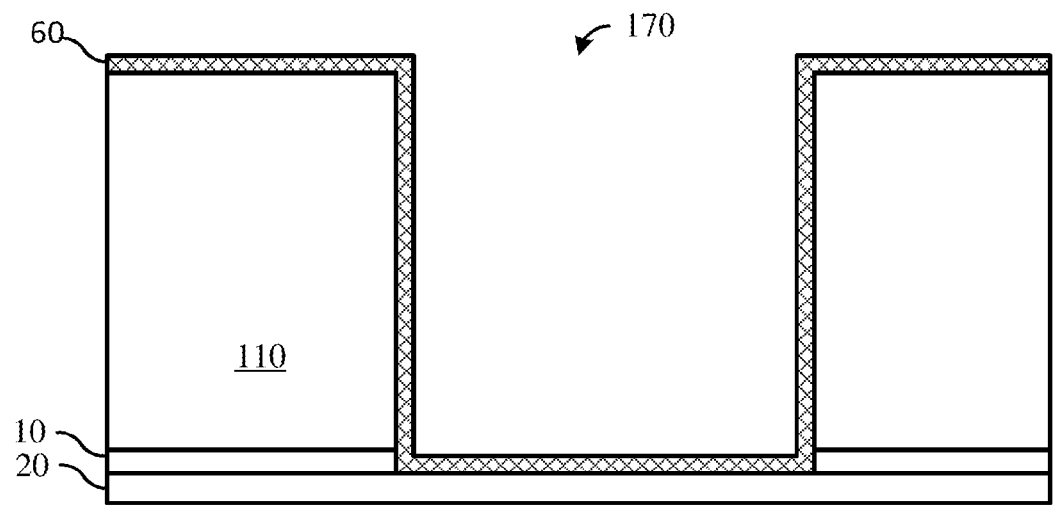
FIG. 14 illustrates a semiconductor device during fabrication after forming a back side metallization layer in accordance with embodiments of the present invention.

FIG. 14 illustrates a semiconductor device during fabrication after forming a back side metallization layer in accordance with embodiments of the present invention.

Referring to FIG. 14, a back side metallization layer 60 is deposited as described in prior embodiments. The back side metallization layer 60 may be formed continuously over the back side of the substrate 100, and the sidewalls of the substrate 100, and the exposed carrier 10. The back side metallization layer 60 may be broken or diced after removing the adhesive component 10 between the carrier 20 and the substrate 100 so as to remove the plurality of dies (such as the first chip 110 and the second chip 120).

FIG. 15-18 illustrates an alternative embodiment of the semiconductor device during fabrication in accordance with an embodiment of the present invention.

Figure 15:
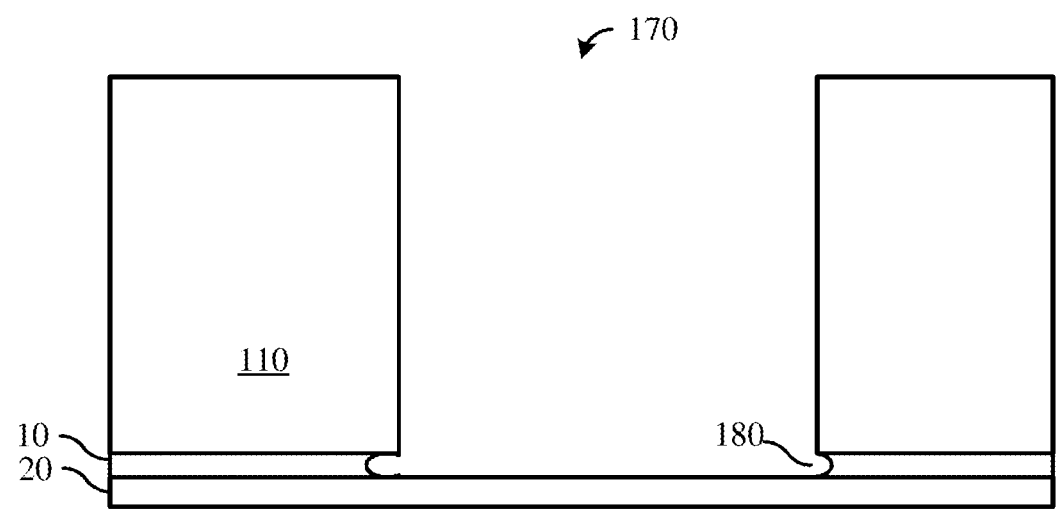
FIG. 15 illustrates a semiconductor device during fabrication after forming a lateral undercut in accordance with embodiments of the present invention.

FIG. 15 illustrates a semiconductor device during fabrication after forming a lateral undercut in accordance with embodiments of the present invention.

In this embodiment, after etching the adhesive component 10 in FIG. 13 and prior to the formation of the backside metallization layer in FIG. 14, an additional lateral undercut 180 is formed. Accordingly, an isotropic etching is performed after the anisotropic etching to remove the exposed adhesive component 10 from over the carrier 20. The isotropic etching may be a timed etch to obtain a certain amount of lateral undercut 180.

Figure 16:
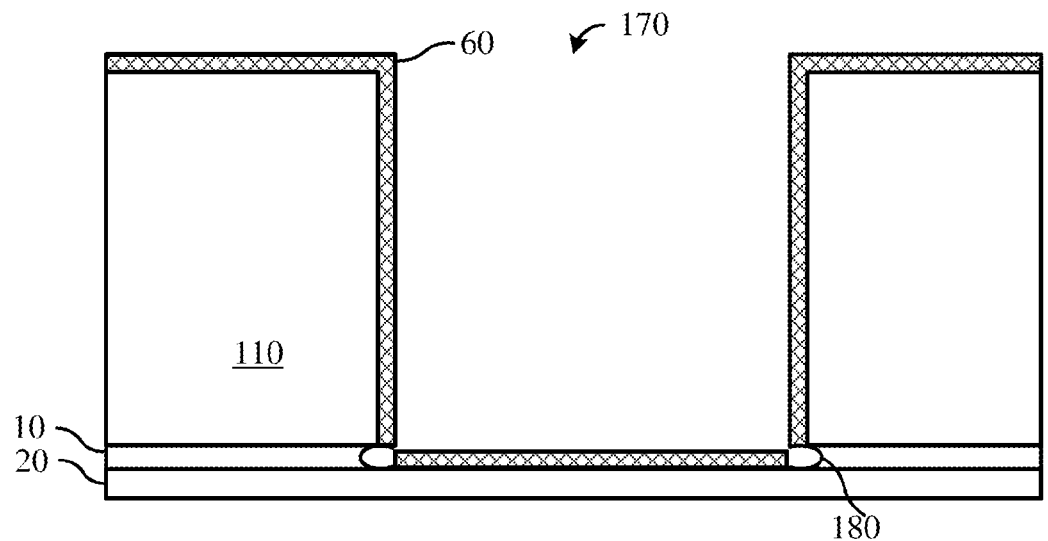
FIG. 16 illustrates a semiconductor device during fabrication after forming a back side metallization layer in accordance with embodiments of the present invention.

FIG. 16 illustrates a semiconductor device during fabrication after forming a back side metallization layer in accordance with embodiments of the present invention.

A back side metallization layer is formed as in the prior embodiment illustrated in FIG. 14. However, because of the lateral undercut 180, the back side metallization layer 60 is not formed as a continuous layer.

Figure 17:
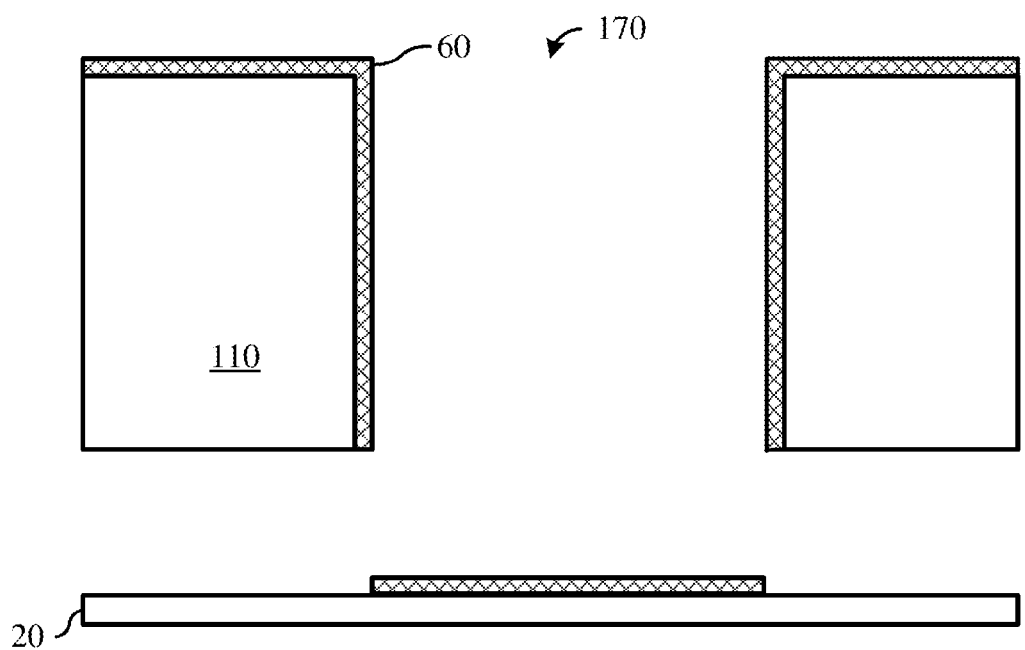
FIG. 17 illustrates a semiconductor device during fabrication after removing the substrate from the carrier in accordance with embodiments of the present invention.

FIG. 17 illustrates a semiconductor device during fabrication after removing the substrate from the carrier in accordance with embodiments of the present invention.

Because the back side metallization layer 60 is not formed continuously, removing the adhesive component 10 is sufficient to separate the substrate 100 into the plurality of dies. Unlike prior embodiments, advantageously, no dicing or breaking of the back side metallization layer 60 is required in this embodiment thereby preventing any delamination, cracking, etc. of the back side metallization layer 60 during demounting of the substrate 100 from the carrier 20.

Figure 18:
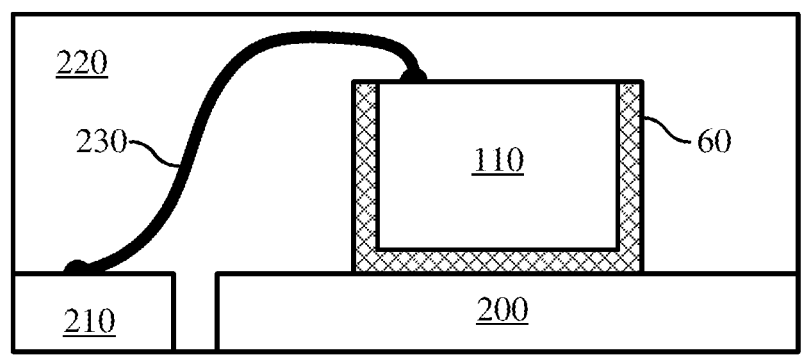
FIG. 18 illustrates a semiconductor package comprising the diced semiconductor die in accordance with embodiments of the present invention.

FIG. 18 illustrates a semiconductor package comprising the diced semiconductor die in accordance with embodiments of the present invention.

After singulation, the chips may undergo an assembly process to form a semiconductor package. In FIG. 18, the first chip 110 is mounted over a die paddle 200 of a leadframe and the back side metallization layer 60 of the first chip 110 is coupled to the die paddle 200. The front side contacts may be coupled to one or more leads 210 using interconnects 230, which may be wires, clips, and others. An encapsulant 220 surrounds the first chip 110, the interconnects 230, the die paddle 200, the leads 210 protecting the components.

FIG. 19-27 illustrates an alternative embodiment of the semiconductor device during fabrication in accordance with an embodiment of the present invention.

Figure 19:
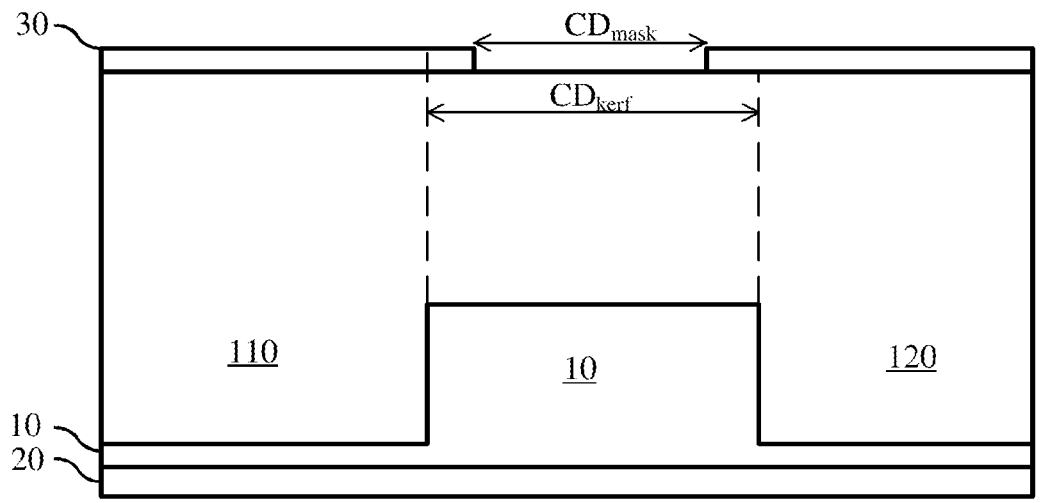
FIG. 19 illustrates a semiconductor device during fabrication after mounting the substrate over the carrier in accordance with embodiments of the present invention.

FIG. 19 illustrates a semiconductor device during fabrication after mounting the substrate over the carrier in accordance with embodiments of the present invention.

Unlike the embodiment of FIG. 10, in this embodiment, the critical dimension of the patterned resist layer 30 $CD_{MASK}$ is less than the critical dimension $CD_{KERF}$ of the dicing channels.

Figure 20:
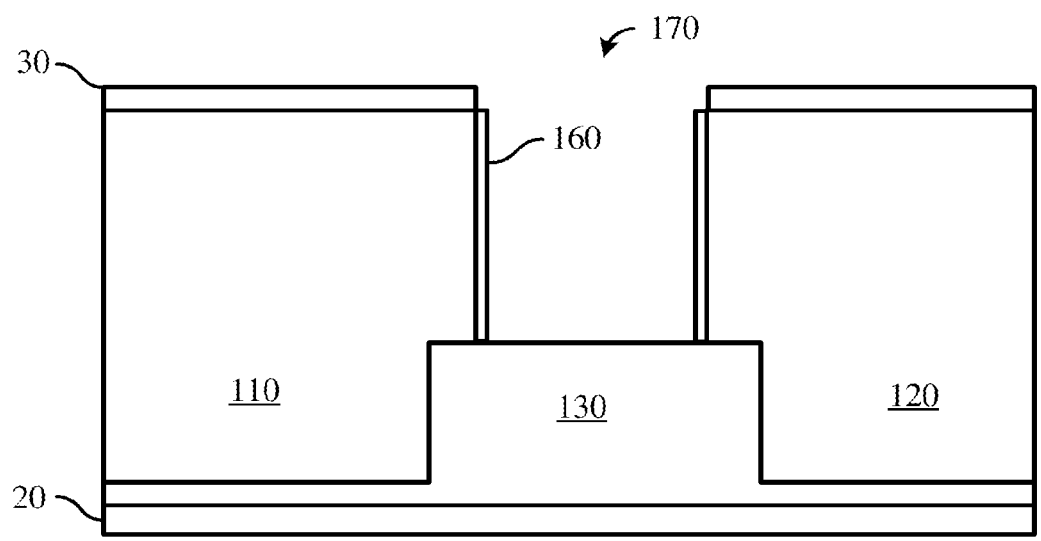
FIG. 20 illustrates a semiconductor device during fabrication after etching the substrate at the kerf regions in accordance with embodiments of the present invention.

FIG. 20 illustrates a semiconductor device during fabrication after etching the substrate at the kerf regions in accordance with embodiments of the present invention.

As described in FIG. 11 previously, the exposed substrate 100 is etched using a deep reaction ion etching process to expose the adhesive component 10. The sidewalls of the dicing trench 170 thus formed are coated with the polymer residue 160.

Figure 21:
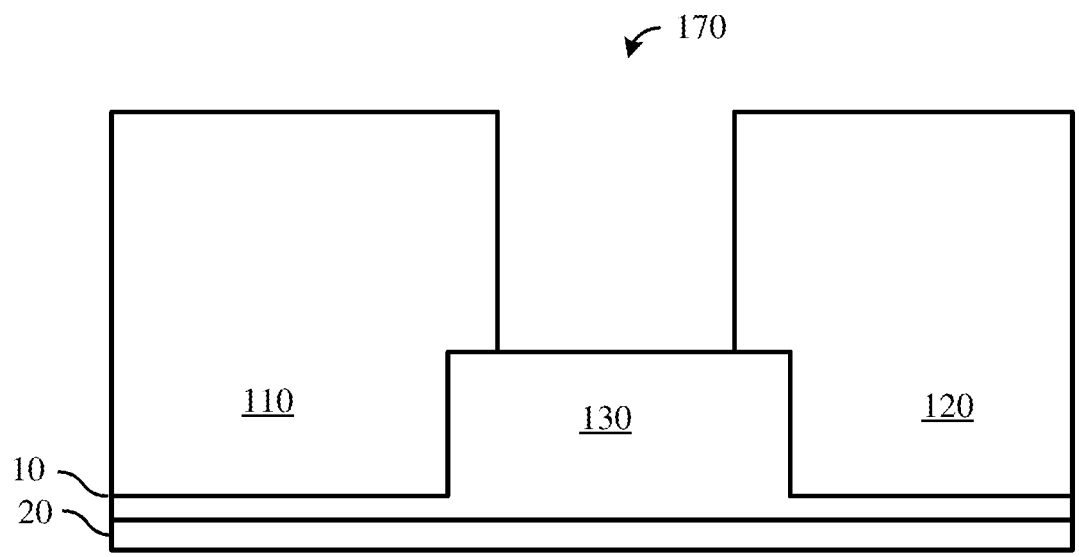
FIG. 21 illustrates a semiconductor device during fabrication after etching the polymer residue in accordance with embodiments of the present invention.

FIG. 21 illustrates a semiconductor device during fabrication after etching the polymer residue in accordance with embodiments of the present invention.

Similar to the embodiment described in FIG. 12, the polymer residue 160 is removed.

Figure 22:
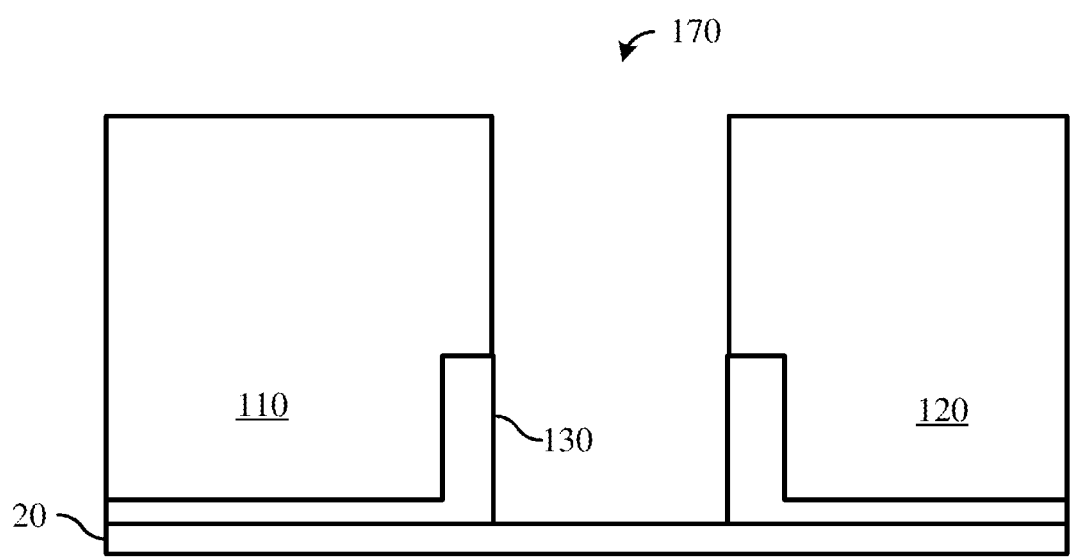
FIG. 22 illustrates a semiconductor device during fabrication after etching the exposed adhesive component in accordance with embodiments of the present invention.

FIG. 22 illustrates a semiconductor device during fabrication after etching the exposed adhesive component in accordance with embodiments of the present invention.

Similar to the embodiment described in FIG. 13, the exposed adhesive component 10 in the dicing trench 170 is removed. However, unlike the prior embodiment, the etching of the exposed adhesive component 10 forms a spacer 130.

Figure 23:
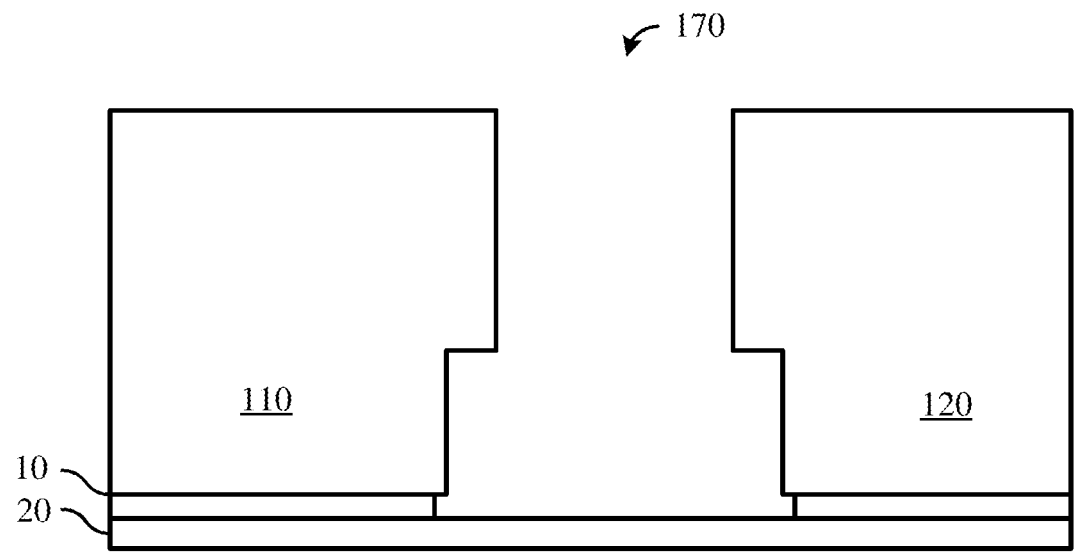
FIG. 23 illustrates a semiconductor device during fabrication after an isotropic etching of the exposed adhesive component in accordance with embodiments of the present invention.

FIG. 23 illustrates a semiconductor device during fabrication after an isotropic etching of the exposed adhesive component in accordance with embodiments of the present invention.

Similar to the embodiment described in FIG. 15, the exposed adhesive component 10 is etched laterally using an isotropic etching process. The isotropic etching removes the spacer 130 thereby ensuring that the subsequent back side metallization layer is not formed continuously.

Figure 24:
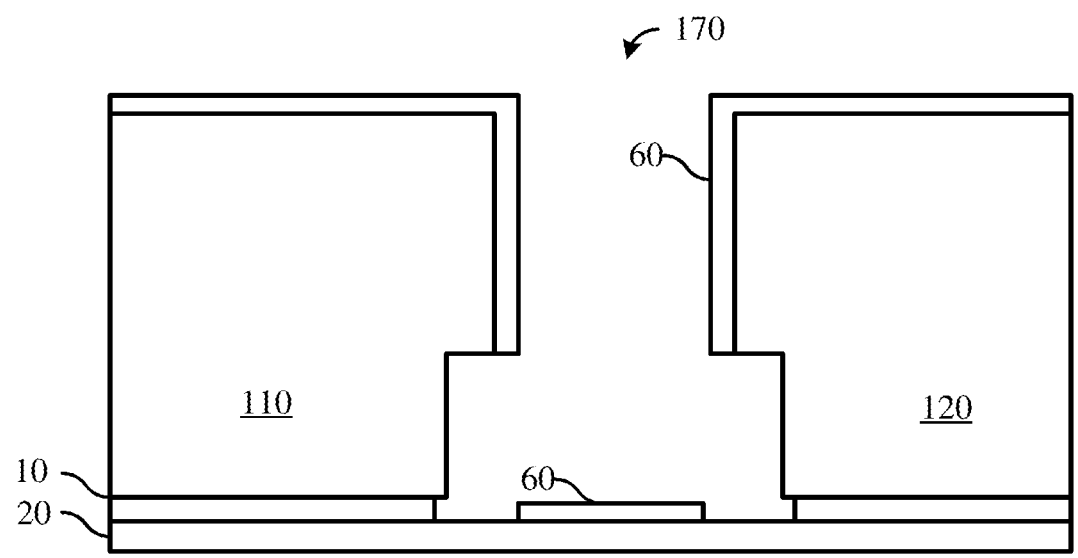
FIG. 24 illustrates a semiconductor device during fabrication after depositing a back side metallization layer in accordance with embodiments of the present invention.

FIG. 24 illustrates a semiconductor device during fabrication after depositing a back side metallization layer in accordance with embodiments of the present invention.

After removing the spacer 130, the back side metallization layer 60 is deposited on the sidewalls and back side of the substrate 100. Because of the directional deposition process, the metal layers are not deposited in the lower portion of the sidewalls that are spaced apart from the upper portion of the sidewalls.

Figure 25:
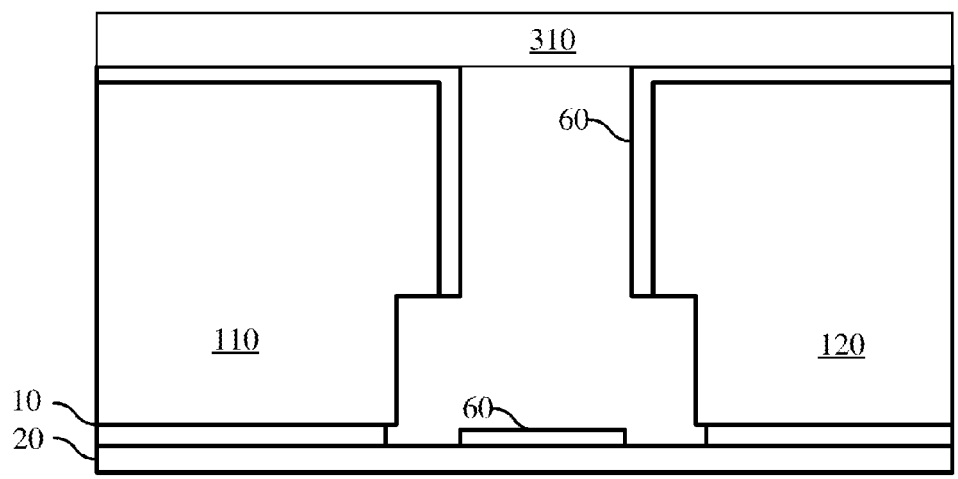
FIG. 25 illustrates a semiconductor device during fabrication after attaching the back side of the substrate to a tape in accordance with embodiments of the present invention.

FIG. 25 illustrates a semiconductor device during fabrication after attaching the back side of the substrate to a tape in accordance with embodiments of the present invention.

As illustrated in FIG. 25, a tape layer 310 is attached to the substrate 100.

Figure 26:
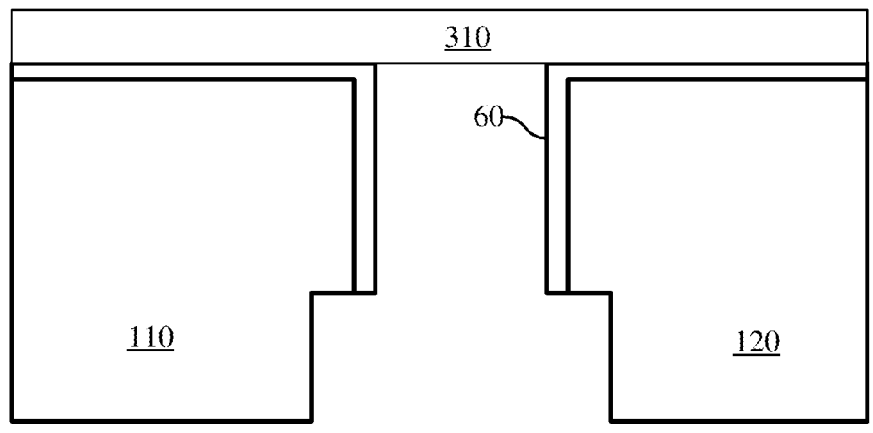
FIG. 26 illustrates a semiconductor device during fabrication after separating the substrate from the carrier in accordance with embodiments of the present invention.
Figure 26:

FIG. 26 illustrates a semiconductor device during fabrication after separating the substrate from the carrier in accordance with embodiments of the present invention.

The adhesive component 10 may be removed so as to detach the substrate 100 from the carrier 20. Thus, dies, such as the first chip 110 and the second chip 120, remain attached to the tape layer 310 and may be processed according to conventional processing.

Figure 27:
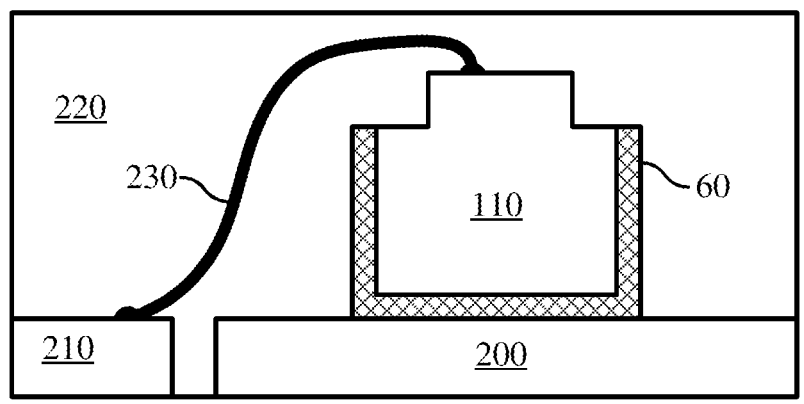
FIG. 27 illustrates a semiconductor package comprising the diced semiconductor die in accordance with an alternative embodiment of the present invention.

FIG. 27 illustrates a semiconductor package comprising the diced semiconductor die in accordance with an alternative embodiment of the present invention.

After singulation described in FIG. 26, the chips may undergo an assembly process to form a semiconductor package. Similar to FIG. 18, in FIG. 27, the first chip 110 is picked up from the tape 310 and mounted over a die paddle 200 of a leadframe and the back side metallization layer 60 of the first chip 110 is coupled to the die paddle 200. The front side contacts may be coupled to one or more leads 210 using interconnects 230, which may be wires, clips, and others. An encapsulant 220 surrounds the first chip 110, the interconnects 230, the die paddle 200, the leads 210 protecting the components.

Unlike the embodiment described in FIG. 18, the first chip 110 includes two portions of the sidewall, a first portion covered with the back side metallization layer 60 and a second portion spaced away and not covered with any metal layers.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-27 may be combined with each other. It is therefore intended that the appended claims encompass any such modifications or embodiments.

What is claimed is:

1. A method of forming a semiconductor device, the method comprising:
    using an adhesive component, mounting a substrate comprising a trench in a kerf region to a carrier, the adhesive component disposed at least partially within the trench;
    forming a through trench through the substrate to expose the adhesive component;
    forming a mesa comprising the adhesive component while forming the through trench;
    etching the mesa to expose the carrier using an anisotropic etch process; and
    forming a metal layer over sidewalls of the through trench.

2. The method of claim 1, further comprising:
    after exposing the carrier, etching the adhesive component under the substrate using an isotropic process to form an undercut under the substrate.

3. The method of claim 1, wherein the adhesive component comprises a glue.

4. The method of claim 1, wherein the trench comprises a first critical dimension along a first lateral direction, and wherein the through trench comprises a second critical dimension along the first lateral direction, and wherein the second critical dimension is larger than the first critical dimension.

5. The method of claim 1, further comprising:
    forming a polymer residue layer on sidewalls of the through trench during forming of the through trench; and
    removing the polymer residue before forming the metal layer.

6. A method of forming a semiconductor device, the method comprising:
    using an adhesive component, mounting a substrate comprising a trench in a kerf region to a carrier, the adhesive component disposed at least partially within the trench;
    forming a through trench through the substrate to expose the adhesive component;
    forming a spacer on sidewalls of the substrate by etching the adhesive component; and
    forming a metal layer over sidewalls of the through trench.

7. The method of claim 6, further comprising etching the exposed adhesive component to expose the carrier.

8. The method of claim 7, further comprising removing the spacer before forming the metal layer.

9. The method of claim 8, wherein removing the spacer comprises
    after exposing the carrier, etching the adhesive component under the substrate using an isotropic process to form an undercut under the substrate.

10. The method of claim 6, wherein the adhesive component comprises a glue.

11. The method of claim 6, wherein the trench comprises a first critical dimension along a first lateral direction, and wherein the through trench comprises a second critical dimension along the first lateral direction, and wherein the second critical dimension is smaller than the first critical dimension.

12. The method of claim 6, further comprising:
- forming a polymer residue layer on sidewalls of the through trench during forming of the through trench; and
- removing the polymer residue before forming the metal layer.

13. A method of forming a semiconductor device, the method comprising:
- forming active regions in a first side of a semiconductor substrate;
- forming a trench in a kerf region of the semiconductor substrate, the trench extending from the first side;
- using an adhesive component, mounting a second side of the semiconductor substrate to a carrier, the adhesive component at least partially filling the trench, the second side being opposite the first side;
- forming a through trench through the substrate to expose the adhesive component;
- etching the adhesive component to form a residual adhesive component region; and
- forming a metal layer over sidewalls of the through trench.

14. The method of claim 13, wherein the residual adhesive component region is a mesa comprising the adhesive component, the method further comprising etching, using an anisotropic etch process, the mesa to expose the carrier.

15. The method of claim 13, wherein the residual adhesive component region is a spacer formed on sidewalls of the substrate.

16. The method of claim 15, further comprising removing the spacer before forming the metal layer.

17. The method of claim 16, wherein removing the spacer comprises
- after exposing the carrier, etching the adhesive component under the semiconductor substrate using an isotropic process to form an undercut under the semiconductor substrate.

18. The method of claim 13, further comprising:
- forming a polymer residue layer on sidewalls of the through trench during forming of the through trench; and
- removing the polymer residue before forming the metal layer.

19. The method of claim 13, wherein the adhesive component comprises a glue.

20. The method of claim 13, wherein the trench comprises a first critical dimension along a first lateral direction, and wherein the through trench comprises a second critical dimension along the first lateral direction, and wherein the second critical dimension is larger than the first critical dimension.

* * * * *